(12) United States Patent
Ke et al.

(10) Patent No.: US 10,985,300 B2
(45) Date of Patent: Apr. 20, 2021

(54) ENCAPSULATION METHOD FOR FLIP CHIP

(71) Applicant: Quan Ke, Guangdong (CN)

(72) Inventors: Quan Ke, Guangdong (CN); Futing Yi, Beijing (CN); Ming Pan, Beijing (CN)

( * ) Notice: Subject to any disclaimer, the term of this patent is extended or adjusted under 35 U.S.C. 154(b) by 0 days.

(21) Appl. No.: 15/757,902

(22) PCT Filed: Apr. 26, 2016

(86) PCT No.: PCT/CN2016/080209
§ 371 (c)(1),
(2) Date: Mar. 6, 2018

(87) PCT Pub. No.: WO2017/041491
PCT Pub. Date: Mar. 16, 2017

(65) Prior Publication Data
US 2018/0261743 A1 Sep. 13, 2018

(30) Foreign Application Priority Data

Sep. 11, 2015 (CN) .......................... 201510579955.1

(51) Int. Cl.
*H01L 33/62* (2010.01)
*H01L 21/56* (2006.01)
(Continued)

(52) U.S. Cl.
CPC ............ *H01L 33/62* (2013.01); *H01L 21/283* (2013.01); *H01L 21/568* (2013.01);
(Continued)

(58) Field of Classification Search
None
See application file for complete search history.

(56) References Cited

U.S. PATENT DOCUMENTS 5,405,813 A * 4/1995 Rodrigues ............... G03F 7/162
427/126.1
2004/0007779 A1 1/2004 Arbuthnot
(Continued)

FOREIGN PATENT DOCUMENTS

| CN | 101452862 | 6/2006 |
| CN | 101436553 | 5/2009 |

(Continued)

OTHER PUBLICATIONS

CN103488051A, Jan. 1, 2014, Machine Translation (Year: 2014).*
(Continued)

*Primary Examiner* — Andres Munoz
(74) *Attorney, Agent, or Firm* — Houston Beshining Law Office PLLC; Liangang Ye

(57) ABSTRACT

An encapsulation method for a flip chip that includes electroforming metal on an electrode surface of a flip chip and a surface of an encapsulation substrate simultaneously. The encapsulation method specifically includes setting an encapsulation substrate around a flip chip; plating a metal conducting film on an electrode surface of the flip chip and a surface of the encapsulation substrate; coating a photoresist on a surface of the metal conducting film; aligning and photoetching an electrode structure on a photoetching plate and an electrode structure of the flip chip, and covering an insulating part between electrodes with the photoresist; taking the metal conducting film as the electrode, electroforming metal inside the photoresist structural model; and removing the photoresist covering the insulating part and removing the metal conducting film. The encapsulation method adopts electroforming and photoetching technology, and thus the process is simplified and the production efficiency is improved.

1 Claim, 7 Drawing Sheets

(51) Int. Cl.
*H01L 21/283* (2006.01)
*H01L 33/00* (2010.01)
*H01L 33/52* (2010.01)

(52) U.S. Cl.
CPC ............ *H01L 33/005* (2013.01); *H01L 33/52* (2013.01); *H01L 2224/04105* (2013.01); *H01L 2224/19* (2013.01); *H01L 2224/96* (2013.01); *H01L 2924/18162* (2013.01); *H01L 2933/0066* (2013.01)

(56) References Cited

U.S. PATENT DOCUMENTS

| | | | |
|---|---|---|---|
| 2006/0086449 A1 | 4/2006 | Nakayama | |
| 2007/0256917 A1* | 11/2007 | Oberhammer | H01H 59/0009 200/181 |
| 2009/0166068 A1 | 7/2009 | Takahashi | |
| 2010/0062564 A1 | 3/2010 | Sakaguchi | |
| 2012/0248486 A1* | 10/2012 | Suh | H01L 33/486 257/98 |
| 2012/0302124 A1* | 11/2012 | Imazu | H01L 33/486 445/58 |
| 2015/0076545 A1 | 3/2015 | Nakatani | |
| 2015/0325748 A1* | 11/2015 | Ting | H01L 33/40 257/98 |
| 2018/0261743 A1* | 9/2018 | Ke | H01L 33/62 |

FOREIGN PATENT DOCUMENTS

| | | | |
|---|---|---|---|
| CN | 101452862 | | 6/2009 |
| CN | 101728466 | | 6/2010 |
| CN | 103084135 | | 5/2013 |
| CN | 103094135 | | 5/2013 |
| CN | 103488051 A | * | 1/2014 |
| CN | 103794587 | | 5/2014 |
| CN | 104658929 | | 5/2015 |
| CN | 105161436 | | 12/2015 |
| JP | 2004-48012 A | | 2/2004 |
| JP | 2009-164221 A | | 7/2009 |
| JP | 2010-62430 A | | 3/2010 |
| WO | 2011093454 A1 | | 6/2013 |
| WO | 2014034024 A1 | | 8/2016 |

OTHER PUBLICATIONS

International Search Report and Written Opinion for PCT/CN2016/080209 dated Aug. 1, 2016.
First Office Action issued for Chinese Patent Application No. CN201510579955.1 dated May 31, 2017.
Second Office Action issued for Chinese Patent Application No. CN201510579955.1 dated Dec. 22, 2017.
First Office Action issued in the counterpart Japanese application No. 2018-532495 dated Sep. 24, 2019.

* cited by examiner

ENCAPSULATION METHOD FOR FLIP CHIP

This application claims priority of a Chinese patent application CN201510579955.1 filed on Sep. 11, 2015. This application cites the full text of the above Chinese patent application.

FIELD OF INVENTION

The present invention relates to an encapsulation method for a flip chip, and more particularly, to an encapsulation method for a flip chip based on electroforming technology.

PRIOR ARTS

With the development of flip chip technology, especially the popularity of semiconductor LED (light emitting diode) lighting, the use of flip encapsulation for semiconductor LED chips has become a trend, and the flip encapsulation generally uses three kinds of methods i.e. eutectic, solder paste and elargol for die bonding. But no matter what method is used, high precision die bonding is necessary because the distance between positive and negative electrodes of the flip chip can't be very large; flip chip eutectic technology involves expensive production equipment and materials, which makes it costly and advantage of cost performance can't be reflected, and encapsulation method of solder paste and elargol are limited to lower reliability and poorer thermal conductivity, and can't be used for encapsulation of a high-power flip chip, and flip-LED technology has been come out for a long time, but limited by many reasons, it delays popularizing.

In addition to the three common bonding methods of the flip chip, there is also a newly emerging electromagnetic pulse-weld bonding method as described in the Chinese patent application "Encapsulation Method for a Flip Chip" (Publication No. CN103094135A); an advantage of this kind of bonding method is that a chip electrode and a substrate electrode are atomically connected, which is very conducive to heat dissipation of the high-power flip chip, however, in the process of development, it is found that when using the electromagnetic pulse-weld method to bond, alignment accuracy of the chip electrode and the substrate electrode becomes a key factor affecting encapsulation efficiency and finished product; and another kind of encapsulation method, as used in the Chinese patent application "Encapsulation Method and Device for a Flip Chip" (Publication No. CN104658929A), is that after the chip and the metal substrate being bonded, the metal substrate is cut along an insulating region between electrodes on the chip by means of laser cutting or the like to cut off electrical connection between electrodes of the chip, thus cutting off electrical connection between electrodes of the corresponding chip, but a hidden danger of this method is that this cutting action will lead to greater stress on the chip, although it is only cutting metal, it might pass through two electrodes that have been fixed, thus adversely affecting the chip.

CONTENT OF THE PRESENT INVENTION

The technical problem to be solved in the present invention is providing an encapsulation method for a flip chip to overcome the defects of conventional encapsulation bonding method of the flip chip in the prior art.

The present invention solves the above-mentioned technical problem through the following technical solutions: the present invention provides an encapsulation method for a flip chip, wherein comprising: electroforming metal on an electrode surface of a flip chip and a surface of an encapsulation substrate simultaneously, to realize a connection between an electrode of the flip chip and the encapsulation substrate through the metal.

Preferably, the encapsulation method for the flip chip comprises the following steps:

$S_1$, setting an encapsulation substrate around the flip chip; preferably, the flip chip is embedded in the encapsulation substrate and the electrode surface of the flip chip is in the same plane as the surface of the encapsulation substrate;

$S_2$, plating a metal conducting film on the electrode surface of the flip chip and the surface of the encapsulation substrate;

$S_3$, coating a photoresist on a surface of the metal conducting film;

$S_4$, aligning an electrode structure on a photoetching plate with an electrode structure of the flip chip on a photoetching machine and performing photoetching, to obtain a photoresist structural model in which the electrode surface of the flip chip and the surface of the encapsulation substrate are in same region after exposure and development, and an insulating part between electrodes of the flip chip is covered with the photoresist;

$S_5$, taking the metal conducting film as an electrode, and electroforming the metal on the electrode surface of the flip chip and the surface of the encapsulation substrate inside the photoresist structural model simultaneously, to enable the interior of the photoresist structural model to be full of the metal, so as to realize connection between the electrode of the flip chip and the encapsulation substrate by means of the metal;

$S_6$, removing the photoresist covering the insulating part and removing the metal conducting film covered by the photoresist in the step $S_4$.

Preferably, after the step $S_6$, further comprising:

$S_7$, removing the encapsulation substrate.

Preferably, the step $S_1$ comprises:

$S_{11}$, arranging a plurality of flip chips in an array on a surface of a silicon baseplate, and contacting the electrode surface of the flip chip with a surface of the silicon baseplate;

$S_{12}$, casting organic glass on a surface of the array of the flip chip, and flattening a surface of the organic glass and solidifying and drying the organic glass to form an organic sheet as an encapsulation substrate;

$S_{13}$, removing the silicon baseplate, so that the flip chip is embedded in the encapsulation substrate and the electrode surface of the flip chip is in the same plane as the surface of the encapsulation substrate.

Preferably, in the step $S_{11}$, the distance between two adjacent flip chips is 6 mm.

Preferably, in the step $S_{12}$, the thickness of the organic sheet is 2 mm.

Preferably, in the step $S_{13}$, the silicon baseplate is removed by grinding or chemical method.

Preferably, the metal conducting film comprises a gold conducting layer and a chromium conducting layer, and the chromium conducting layer is located above the electrode surface of the flip chip and the surface of the encapsulation substrate, and the gold conducting layer is located above the chromium conducting layer.

Preferably, the gold conducting layer has a thickness of 20-400 nm, preferably 50 nm, and the chromium conducting layer has a thickness of 20-400 nm, preferably 20 nm.

Preferably, the photoresist is AZ4620 photoresist, AZ-50XT photoresist, SU8 photoresist or PMMA (organic glass) photoresist. Wherein, the above several kinds of photoresists are all commercially available.

Preferably, in the step $S_3$, the photoresist is coated in a tidal flat method.

Preferably, in the step $S_3$, the photoresist is coated in a rotary method, and rotational speed is 200-6000 revolutions per minute, preferably 1000 revolutions per minute.

Preferably, the metal is copper, nickel or gold.

Preferably, the step $S_6$ comprises:

$S_{61}$, dissolving the photoresist covering at the insulating part with a sol solution;

$S_{62}$, eroding the gold conducting layer covered by the photoresist with a gold corrosion solution;

$S_{63}$, eroding the chromium conducting layer covered by the gold conducting layer with a chromium corrosion solution.

Preferably, the electrode surface of the flip chip is provided with or without a metal layer.

Preferably, the surface of the encapsulation substrate is provided with or without a metal layer.

The positive progress effect of the present invention is that the present invention utilizes electroforming and photoetching technology to accurately ensure the positional accuracy of the electrode structure in the chip, which can meet the need of a slight space between electrodes of the flip chip, meanwhile uses thick photoresist process, and is able to realize good metal connection between the electrode and the substrate, so that the heat generated by the high-power flip chip can be dissipated in time, effectively reducing the thermal resistance, and thus the process is simplified and the production efficiency is improved.

DETAILED DESCRIPTION OF THE PREFERRED EMBODIMENT

The following embodiments further illustrate the present invention, but the present invention is not limited thereto.

Embodiment 1

Figure 1:
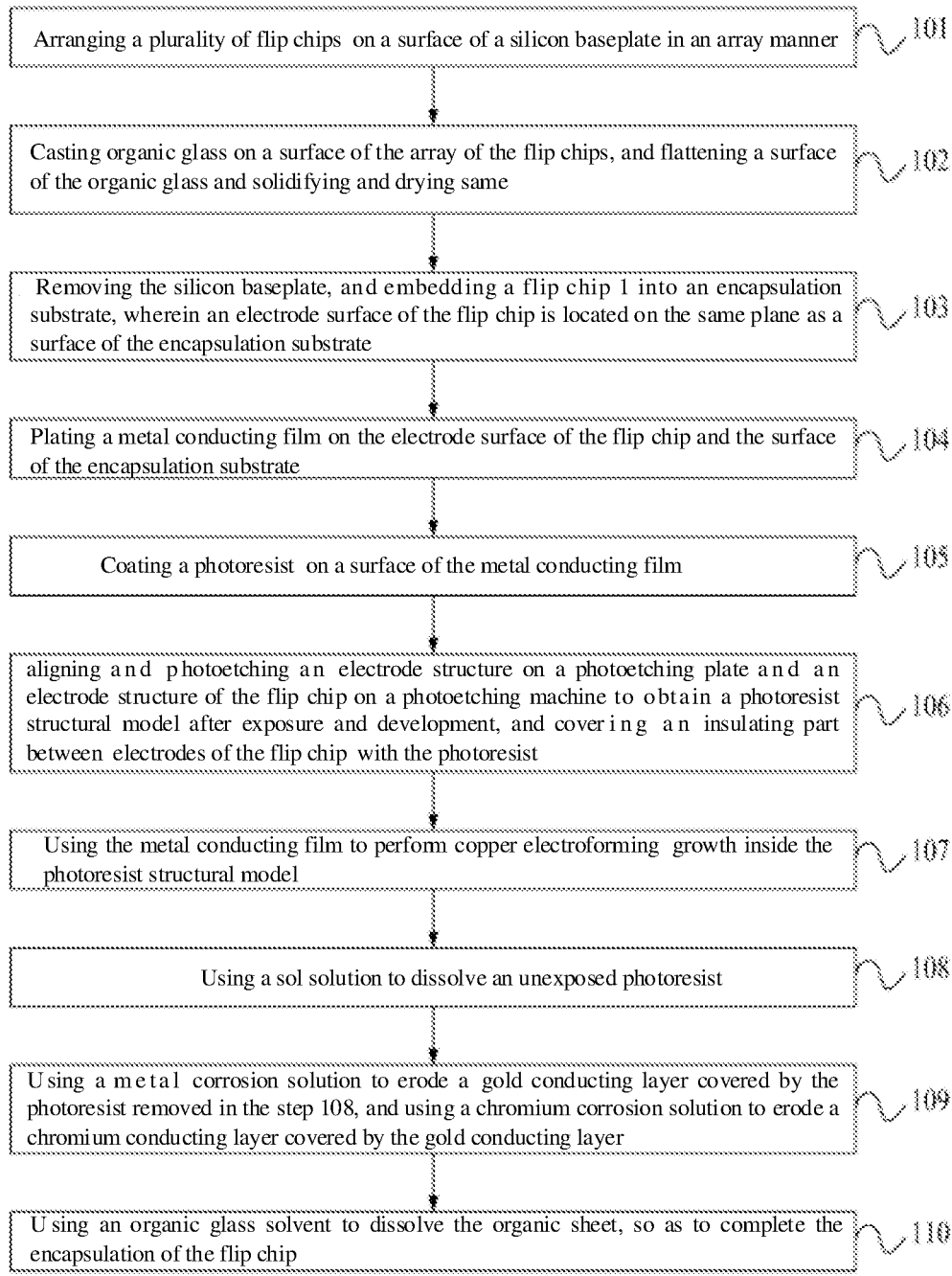
FIG. 1 is a flowchart of an encapsulation method for the flip chip of the embodiment 1 of the present invention.
Figure 2:
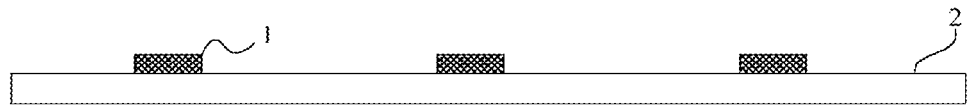
FIG. 2 is a schematic structural diagram of an intermediate product obtained after performing the step 101 in the encapsulation method for the flip chip of the embodiment 1 of the present invention.

As shown in FIG. 1, the encapsulation method for the flip chip in the embodiment comprises the following steps:

Step 101, arranging a plurality of flip chips 1 on a surface of a silicon baseplate 2 in an array manner, and contacting the electrode surface of the flip chip 1 with a surface of the silicon baseplate 2, wherein, preferably, the distance between two adjacent flip chips 1 is 6 mm, and a schematic structural diagram of an intermediate product obtained after performing the step 101 is as shown in FIG. 2.

Figure 3:
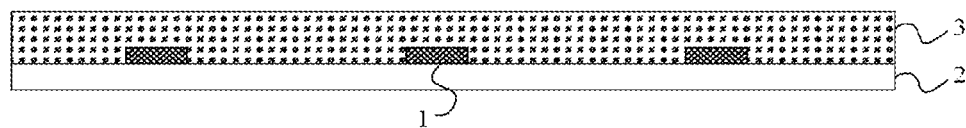
FIG. 3 is a schematic structural diagram of an intermediate product obtained after performing the step 102 in the encapsulation method for the flip chip of the embodiment 1 of the present invention.

Step 102, casting organic glass 3 on a surface of the array of the flip chips 1, and flattening a surface of the organic glass 3 and solidifying and drying the organic glass 3 to form an organic sheet having a thickness of 2 mm, and the organic sheet is used as an encapsulation substrate, and a schematic structural diagram of an intermediate product obtained after performing the step 102 is as shown in FIG. 3.

Figure 4:
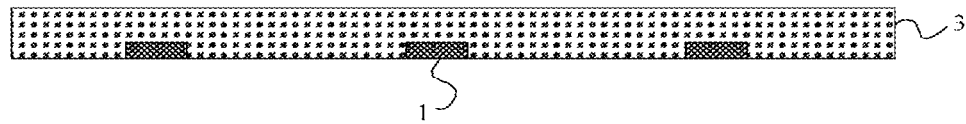
FIG. 4 is a schematic structural diagram of an intermediate product obtained after performing the step 103 in the encapsulation method for the flip chip of the embodiment 1 of the present invention.

Step 103, removing the silicon baseplate 2, specifically, the silicon baseplate can be removed by grinding or chemical method, so that the flip chip 1 is embedded in the encapsulation substrate and the electrode surface of the flip chip is located on the same plane as the surface of the encapsulation substrate, thus the encapsulation substrate with the flip chip 1 embedded in an array manner is obtained, and so that the electrode surface of the flip chip 1 and the surface of the encapsulation substrate are well coincide, and a schematic structural diagram of an intermediate product obtained after performing the step 103 is as shown in FIG. 4.

Figure 5:
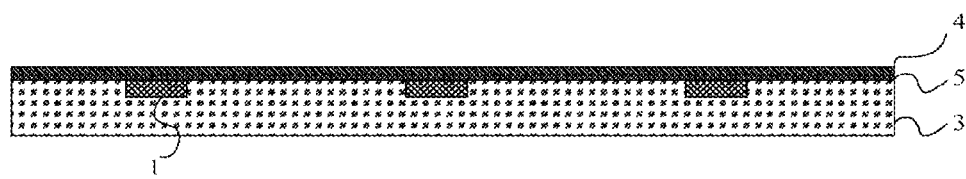
FIG. 5 is a schematic structural diagram of an intermediate product obtained after performing the step 104 in the encapsulation method for the flip chip of the embodiment 1 of the present invention.

Step 104, plating a metal conducting film on the electrode surface of the flip chip 1 and the surface of the encapsulation substrate, so as to be used as an electrode of electroforming process, wherein, the metal conducting film comprises a gold conducting layer 4 and a chromium conducting layer 5, and the chromium conducting layer 5 is located above the electrode surface of the flip chip 1 and the surface of the encapsulation substrate, and the gold conducting layer 4 is located above the chromium conducting layer 5, and preferably, the gold conducting layer has a thickness of 50 nm, and the chromium conducting layer has a thickness of 20 nm, and a schematic structural diagram of an intermediate product obtained after performing the step 104 is as shown in FIG. 5.

Figure 6:
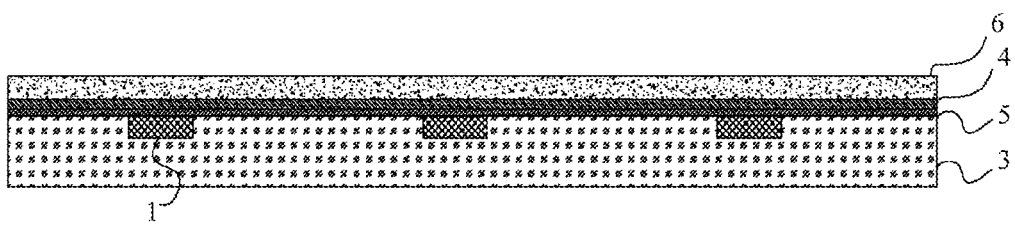
FIG. 6 is a schematic structural diagram of an intermediate product obtained after performing the step 105 in the encapsulation method for the flip chip of the embodiment 1 of the present invention.

Step 105, coating photoresist 6 on a surface of the metal conducting film (specifically, the gold conducting layer 4), and in the embodiment, the photoresist is AZ4620 photoresist, and the AZ4620 photoresist is coated in a rotary method, and the rotational speed is 1000 revolutions per minute, and then the metal conducting film is dried in an oven at 90° C., and a schematic structural diagram of an intermediate product obtained after performing the step 105 is as shown in FIG. 6.

Figure 7:
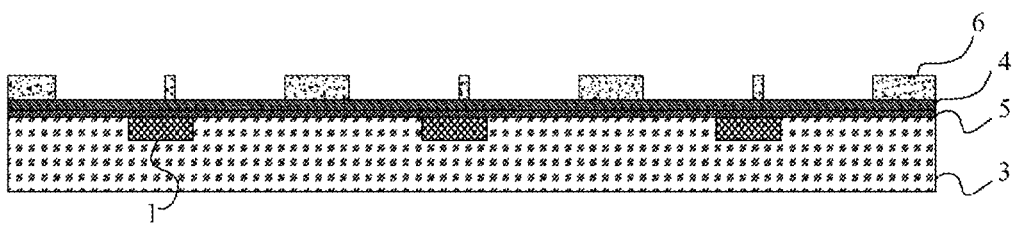
FIG. 7 is a schematic structural diagram of an intermediate product obtained after performing the step 106 in the encapsulation method for the flip chip of the embodiment 1 of the present invention.

Step 106, aligning electrode structure on a photoetching plate with electrode structure of the flip chip 1 on a photoetching machine and performing photoetching, and obtaining a photoresist structural model in which the electrode surface of the flip chip 1 and the surface of the encapsulation substrate are in same region after exposure and development, and an insulating part between electrodes of the flip chip is covered with the photoresist 6, and a schematic structural diagram of an intermediate product obtained after performing the step 106 is as shown in FIG. 7.

Figure 8:
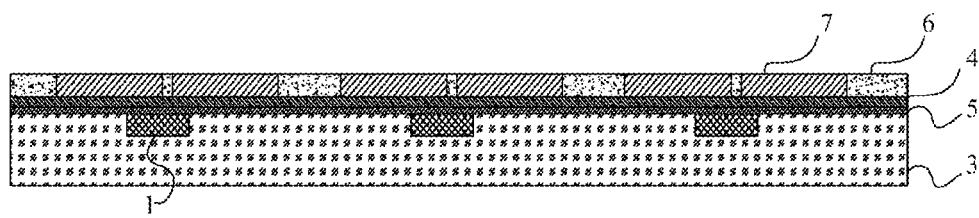
FIG. 8 is a schematic structural diagram of an intermediate product obtained after performing the step 107 in the encapsulation method for the flip chip of the embodiment 1 of the present invention.

Step 107, using the metal conducting film to perform electroforming growth of copper inside the photoresist structural model, and the specific operations are: the metal conducting film being used as an electrode, and electroforming the metal of copper 7 on the electrode surface of the flip chip 1 and the surface of the encapsulation substrate in the photoresist structural model simultaneously, and controlling time and growing speed to ensure that interior of the photoresist structural model in which the electrode surface of the flip chip and the surface of the encapsulation substrate are in same region is overgrown by the metal of copper 7, and to realize connection between the electrode of the flip chip 1 and the encapsulation substrate by means of the metal of copper 7, and a schematic structural diagram of an intermediate product obtained after performing the step 107 is as shown in FIG. 8.

Figure 9:
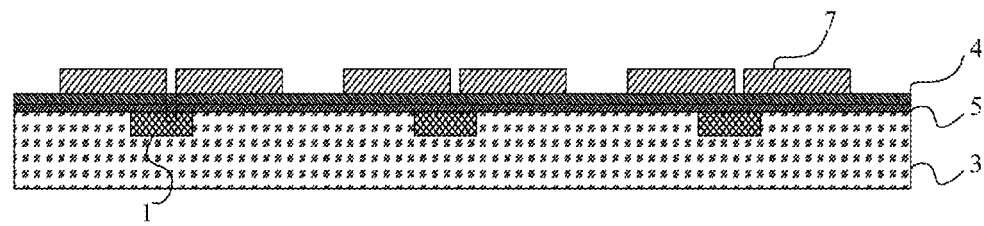
FIG. 9 is a schematic structural diagram of an intermediate product obtained after performing the step 108 in the encapsulation method for the flip chip of the embodiment 1 of the present invention.

Step 108, using a sol solution to dissolve an unexposed photoresist 6, and a schematic structural diagram of an intermediate product obtained after performing the step 108 is as shown in FIG. 9.

Figure 10:
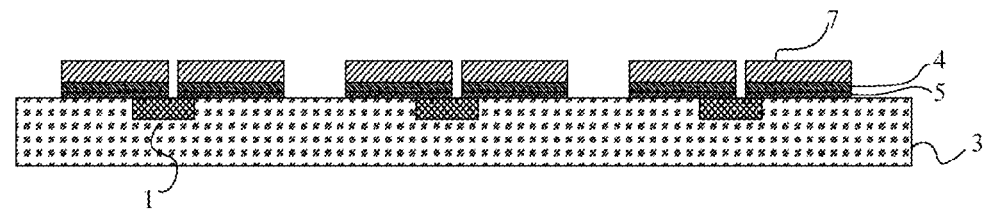
FIG. 10 is a schematic structural diagram of an intermediate product obtained after performing the step 109 in the encapsulation method for the flip chip of the embodiment 1 of the present invention.

Step 109, using a gold corrosion solution to erode the gold conducting layer covered by the photoresist removed in the step 108, and using a chromium corrosion solution to erode the chromium conducting layer covered by the gold conducting layer, thus cutting off the electric connection between electrodes of the flip chip, and a schematic structural diagram of an intermediate product obtained after performing the step 109 is as shown in FIG. 10.

Figure 11:
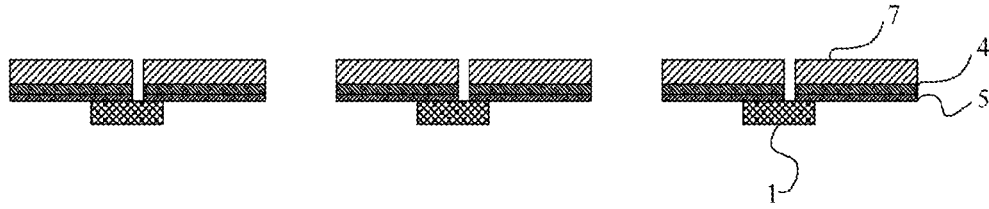
FIG. 11 is a schematic structural diagram of a product obtained after performing the step 110 in the encapsulation method for the flip chip of the embodiment 1 of the present invention.

Step 110, using an organic glass solvent to dissolve the organic sheet (i.e. encapsulation substrate), so as to complete the encapsulation of the flip chip 2, and a schematic structural diagram of a product obtained after performing the step 110 is as shown in FIG. 11.

Wherein, in the embodiment, the flip chip may be specifically LED flip chip, and in specific implementation process, the electrode surface of the flip chip 1 itself is provided with or without a metal layer, and the surface of the encapsulation substrate itself is provided with or without a metal layer.

Embodiment 2

Figure 12:
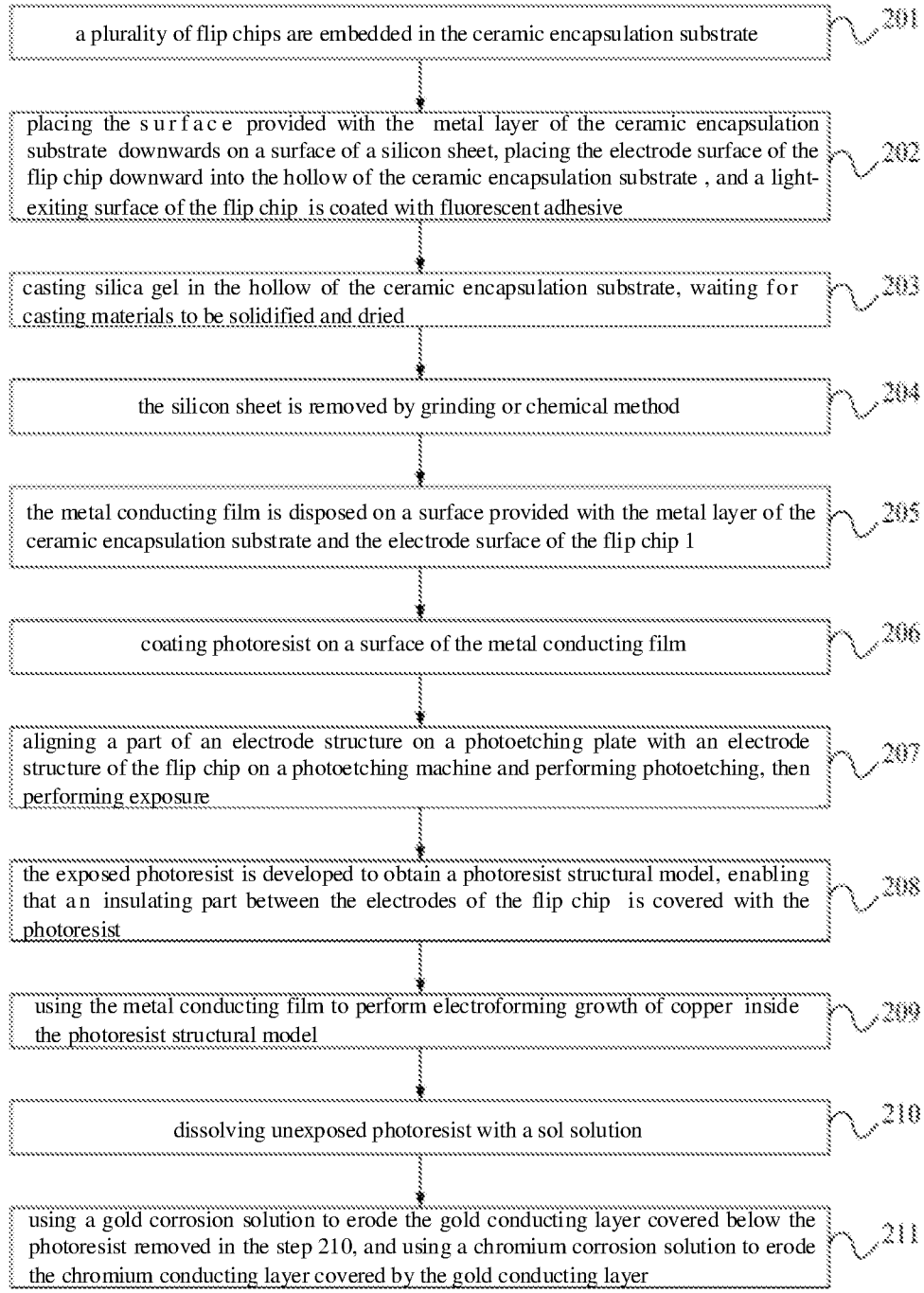
FIG. 12 is a flowchart of an encapsulation method for the flip chip according to embodiment 2 of the present invention.
Figure 13:
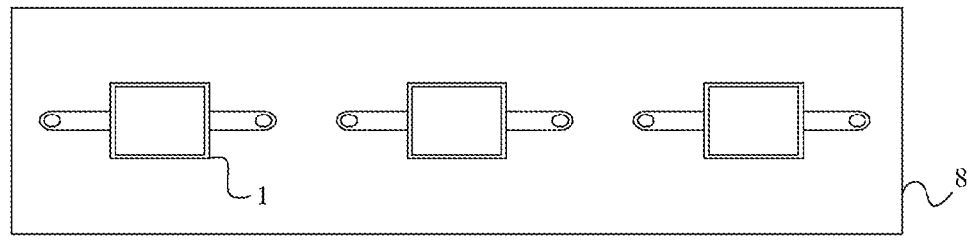
FIG. 13 is a top view of an intermediate product obtained after performing the step 201 in the encapsulation method for the flip chip of the embodiment 2 of the present invention.
Figure 14:
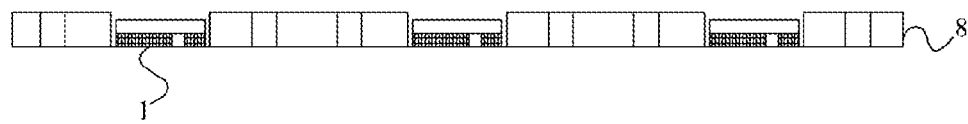
FIG. 14 is a side view of an intermediate product obtained after performing the step 201 in the encapsulation method for the flip chip of the embodiment 2 of the present invention.

The main difference between this embodiment and the embodiment 1 lies in that: in this embodiment, the encapsulation substrate is a ceramic encapsulation substrate. As shown in FIG. 12, the encapsulation method for the flip chip in the embodiment comprises the following steps:

Step 201, a plurality of flip chips 1 are embedded in the ceramic encapsulation substrate 8, and in the embodiment, the flip chips are specifically LED flip chips of 1 mm in length, 1 mm in width and 0.35 mm in thickness, and the type is specifically CREEDA1000, and specific operations are as follows: providing a ceramic encapsulation substrate 8 having a thickness (about 0.6 mm) slightly larger than the thickness of the flip chip 1, and the unit center of each ceramic encapsulation substrate 8 is provided with a hollow notch which is consistent with the shape of the chip but slightly larger in size, and the substrate 8 having a side surface provided with a metal layer corresponding to and insulated from the two electrodes of the flip chip 1 and a through hole having a metal connection with the metal layer for the external heat sink, and a top view and a side view of an intermediate product obtained after performing the step 201 are as shown in FIG. 13 and FIG. 14, respectively.

Figure 15:
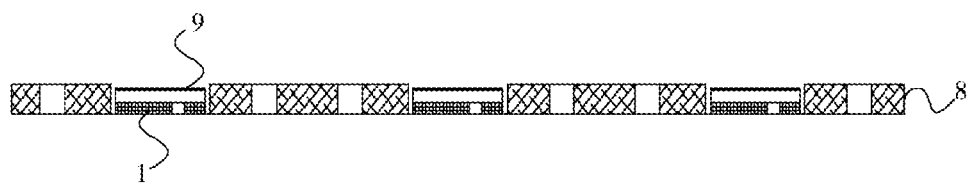
FIG. 15 is a schematic structural diagram of an intermediate product obtained after performing the step 202 in the encapsulation method for the flip chip of the embodiment 2 of the present invention.

Step 202, placing the surface provided with the metal layer of the ceramic encapsulation substrate 8 downwards on a surface of a silicon sheet, placing the electrode surface of the flip chip 1 downward into the hollow of the ceramic encapsulation substrate 8, and a light-exiting surface of the flip chip 1 is coated with fluorescent adhesive 9 and alternatively can be provided with a fluorescent film, and a schematic structural diagram of an intermediate product obtained after performing the step 202 is as shown in FIG. 15.

Figure 16:
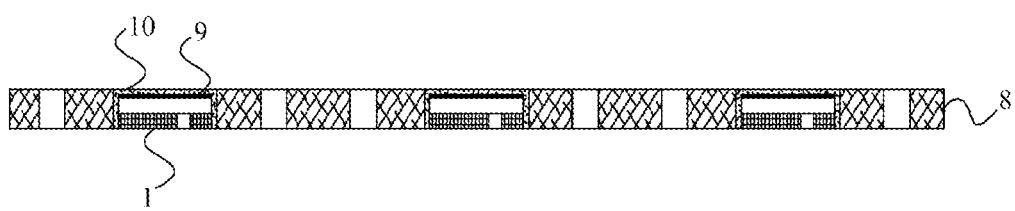
FIG. 16 is a schematic structural diagram of an intermediate product obtained after performing the step 203 in the encapsulation method for the flip chip of the embodiment 2 of the present invention.

Step 203, casting silica gel 10 in the hollow of the ceramic encapsulation substrate 8, waiting for casting materials to be solidified and dried, so that the flip chip 1 and the ceramic encapsulation substrate 8 are fixed by the silica gel 10, and a schematic structural diagram of an intermediate product obtained after performing the step 203 is as shown in FIG. 16.

Step 204, the silicon sheet is removed by grinding or chemical method, so as to obtain an array having the flip chip 1 fixed with the ceramic encapsulation substrate 8 by the silica gel 10, and the electrode surface of the flip chip 1 and the surface of the ceramic encapsulation substrate 8 are well coincide.

Figure 17:
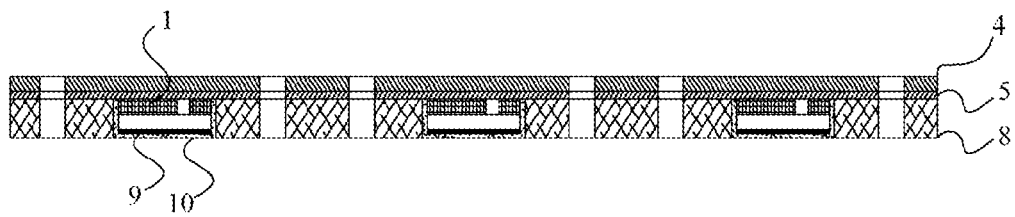
FIG. 17 is a schematic structural diagram of an intermediate product obtained after performing the step 205 in the encapsulation method for the flip chip of the embodiment 2 of the present invention.

Step 205, the metal conducting film is disposed on a surface provided with the metal layer of the ceramic encapsulation substrate 8 and the electrode surface of the flip chip 1, and the metal conducting film also comprises the gold conducting layer 4 and the chrome conducting layer 5, and specific arrangement is the same as that in the step 104 of embodiment 1, and a schematic structural diagram of an intermediate product obtained after performing the step 205 is as shown in FIG. 17.

Figure 18:
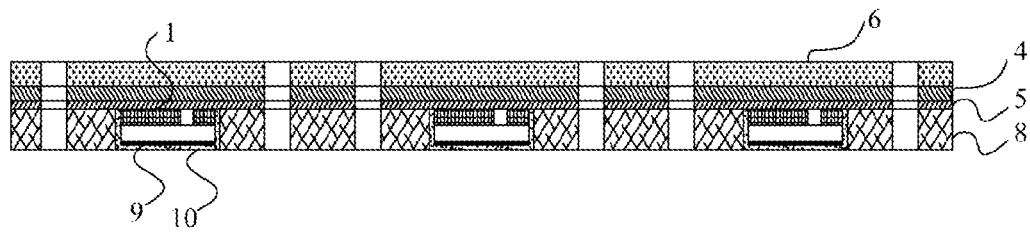
FIG. 18 is a schematic structural diagram of an intermediate product obtained after performing the step 206 in the encapsulation method for the flip chip of the embodiment 2 of the present invention.

Step 206, coating photoresist 6 on a surface of the metal conducting film (specifically, the gold conducting layer 4), and performing method is the same as that in the step 105 of embodiment 1, and a schematic structural diagram of an intermediate product obtained after performing the step 206 is as shown in FIG. 18.

Step 207, aligning a part of an electrode structure on a photoetching plate with an electrode structure of the flip chip 1 on a photoetching machine and performing photoetching, then performing exposure, so that one electrode N of the flip chip 1 and the corresponding surface metal of the ceramic encapsulation substrate 8 are in one region and the surface metal of the ceramic encapsulation substrate 8 corresponding to the other electrode P is in another region.

Figure 19:
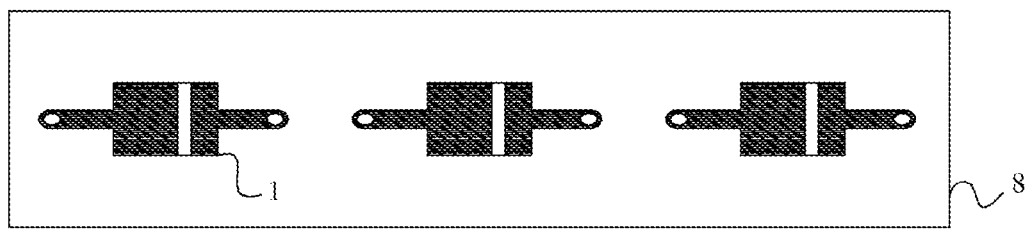
FIG. 19 is a top view of an intermediate product obtained after performing the step 208 in the encapsulation method for the flip chip of the embodiment 2 of the present invention.
Figure 20:
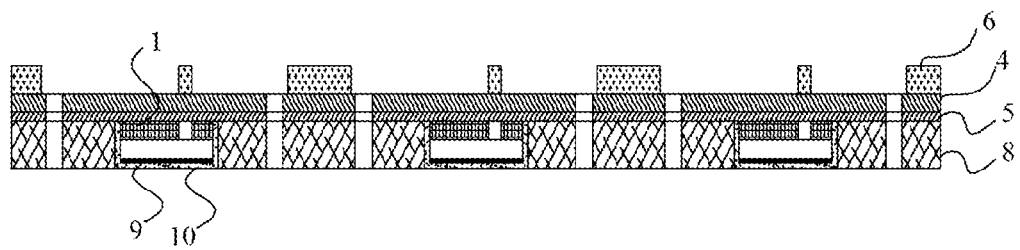
FIG. 20 is a side view of an intermediate product obtained after performing the step 208 in the encapsulation method for the flip chip of the embodiment 2 of the present invention.

Step 208, the exposed photoresist is developed to obtain a photoresist structural model in which the electrode surface of single flip chip and the corresponding surface of the ceramic encapsulation substrate 8 are in the same region, enabling that an insulating part between the electrodes of the flip chip 1 is covered with the photoresist 6, and the top view and the side view of an intermediate product obtained after performing the step 208 are as shown in FIGS. 19 and 20, respectively.

Figure 21:
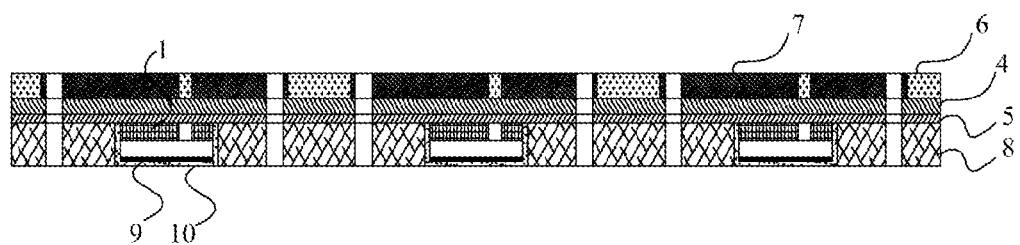
FIG. 21 is a schematic structural diagram of an intermediate product obtained after performing the step 209 in the encapsulation method for the flip chip of the embodiment 2 of the present invention.

Step 209, using the metal conducting film to perform electroforming growth of copper inside the photoresist structural model, and the specific operations are the same as that in the step 107 of embodiment 1, and a schematic structural diagram of an intermediate product obtained after performing the step 209 is as shown in FIG. 21.

Figure 22:
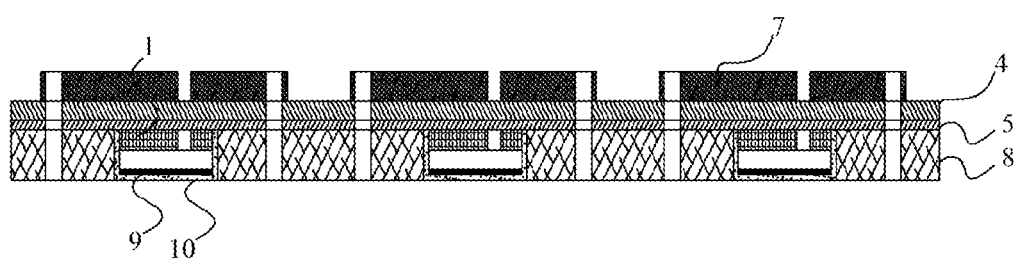
FIG. 22 is a schematic structural diagram of an intermediate product obtained after performing the step 210 in the encapsulation method for the flip chip of the embodiment 2 of the present invention.

Step 210, dissolving unexposed photoresist 6 with a sol solution, and a schematic structural diagram of an intermediate product obtained after performing the step 210 is as shown in FIG. 22.

Figure 23:
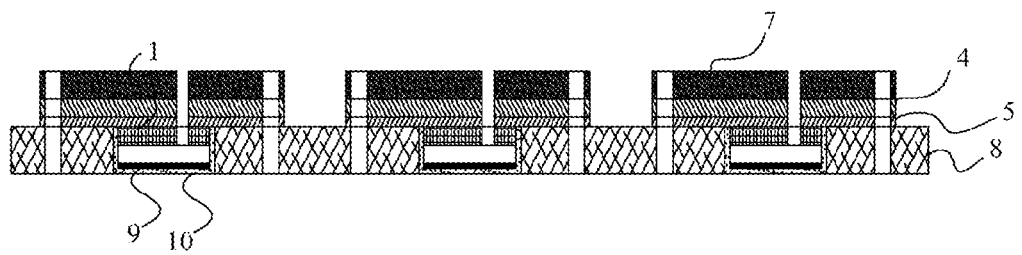
FIG. 23 is a schematic structural diagram of a product obtained after performing the step 211 in the encapsulation method for the flip chip of the embodiment 2 of the present invention.

Step 211, using a gold corrosion solution to erode the gold conducting layer covered below the photoresist removed in the step 210, and using a chromium corrosion solution to erode the chromium conducting layer covered by the gold conducting layer, thus cutting off the electric connection between electrodes of the flip chip, and a schematic structural diagram of a product obtained after performing the step 211 is as shown in FIG. 23.

While specific embodiments of the present invention have been described above, it will be understood by those skilled in the art that these are merely examples and that the scope of the invention is defined by the appended claims. Those skilled in the art may make various changes or modifications to these embodiments without departing from the principle and essence of the present invention, and all such changes and modifications fall into the protection scope of the present invention.

What is claimed is:

1. An encapsulation bonding method for a flip chip, comprising:
    simultaneously electroforming metal on an electrode surface of the flip chip and electroforming metal on a surface of an encapsulation substrate provided with a metal layer, to realize a connection between an electrode of the flip chip and the encapsulation substrate through the metal, and, comprising the following steps:
    S1, setting the encapsulation substrate around the flip chip, so that the flip chip is embedded in the encapsulation substrate and the electrode surface of the flip chip is located on the same plane as the surface of the encapsulation substrate;
    S2, plating a metal conducting film on the electrode surface of the flip chip and the surface of the encapsulation substrate;
    S3, coating a photoresist on a surface of the metal conducting film;
    S4, aligning an electrode structure on a photoetching plate with an electrode structure of the flip chip on a photoetching machine and performing photoetching, to obtain a photoresist structural model in which the electrode surface of the flip chip and the surface of the encapsulation substrate are in a same region after exposure and development, and an insulating part between electrodes of the flip chip is covered with the photoresist;
    S5, taking the metal conducting film as an electrode, and electroforming the metal on the electrode surface of the flip chip and the surface of the encapsulation substrate inside the photoresist structural model simultaneously, to enable the interior of the photoresist structural model to be full of the metal, so as to realize the connection between the electrode of the flip chip and the encapsulation substrate by means of the metal;
    S6, removing the photoresist covering the insulating part and removing the metal conducting film covered by the photoresist in the step S4.

* * * * *